United States Patent [19]

Ogawa et al.

[11] Patent Number: 4,841,341

[45] Date of Patent: Jun. 20, 1989

[54] INTEGRATOR FOR AN EXPOSURE APPARATUS OR THE LIKE

[75] Inventors: Kazufumi Ogawa; Masaru Sasago, both of Hirakata; Masayuki Endo, Izumi; Ken Ishihara, Neyagawa, all of Japan

[73] Assignee: Matsushita Electric Industrial Co., Ltd., Osaka, Japan

[21] Appl. No.: 61,266

[22] Filed: Jun. 12, 1987

[30] Foreign Application Priority Data

Jun. 13, 1986 [JP] Japan ................................ 61-138555
Jun. 27, 1986 [JP] Japan ................................ 61-152454

[51] Int. Cl.$^4$ ...................... G03B 27/70; G03B 27/72
[52] U.S. Cl. ........................................ 355/43; 355/53; 355/67; 350/167
[58] Field of Search ...................... 355/46, 53, 54, 67; 350/167

[56] References Cited

U.S. PATENT DOCUMENTS

| 3,536,378 | 10/1970 | Bishop | 350/167 |
| 3,740,119 | 6/1973 | Sukurai et al. | 350/167 |
| 3,832,032 | 8/1974 | Shimada | 350/167 X |
| 3,941,475 | 3/1976 | Sheets | 350/167 X |
| 3,988,066 | 10/1976 | Suzuki et al. | 350/167 X |
| 4,653,903 | 3/1987 | Torigoe et al. | 355/53 |

Primary Examiner—L. T. Hix
Assistant Examiner—D. Rutledge
Attorney, Agent, or Firm—Wenderoth, Lind & Ponack

[57] ABSTRACT

An exposure apparatus for manufacturing semiconductor devices and in particular an excimer laser exposure apparatus includes, an integrator for uniformly distributing the excimer laser beam used as an exposure light source to render the exposure illuminance uniform at an exposure area. The integrator is characterized by a plurality of concentric-circular or parallel stripe-like recesses on one of two main opposing surfaces so that the light entering one main surface is dispersively radiated from the other main surface to render the excimer laser light from the light source uniform so as to reduce uneven exposure illuminance in the exposure area.

14 Claims, 7 Drawing Sheets

FIG. 6A
FIG. 6B
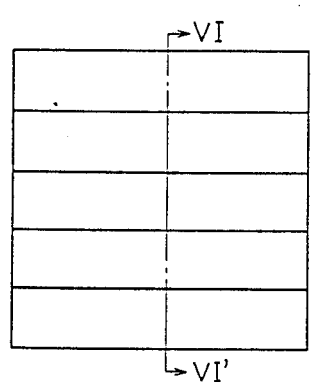
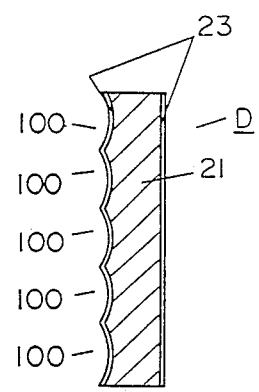

INTEGRATOR FOR AN EXPOSURE APPARATUS OR THE LIKE

BACKGROUND OF THE INVENTION

This invention relates to an integrator and an exposure apparatus employing an integrator.

In particular, this invention relates to an integrator devised for allowing hyperfine working to be performed in a photolithography process employed in manufacturing semiconductor devices and a reduction-projection excimer exposure apparatus using the integrator.

Conventionally, reduction-projection type exposure devices (steppers) which are commercially available use a superhigh voltage mercury-arc lamp as a source of light for the hyperfine working of semiconductor devices, especially, LSIs, VLSIs, etc. However, a conventional stepper uses a g-line (435 nm) and an i-line (365 nm) of a superhigh mercury-ark lamp, so that the resolution is 1.2 $\mu$m for the g-line and 0.8 $\mu$m for the i-line at most. It is virtually impossible to obtain a resolution of 0.5 $\mu$m required for manufacturing 4-Mbit RAMs and 16-Mbit RAMs using those wavelengths.

Recently, the development of exposure devices which use an excimer laser source, for example, emitting Xecl (308 nm), KrF (249 nm) or ArF (193 nm) having a short wavelength compared to the g- and i-lines has begun to be studied.

Although the excimer light source provides high power, its illuminance in a plane varies in a range of not less than 10%. In addition, the beam diameter of the light source is small, for example, about 2 cm, so that it is necessary to change the beam shape to adjust to the mask and the reduction lens. In other words, it is necessary to expand the beam diameter with a uniform illuminance so that the entire mask is irradiated with light.

SUMMARY OF THE INVENTION

It is therefore an object of this invention to dispose a light distribution plate (integrator), which exhibits excellent distribution performance and is capable of uniformly distributing light, between an excimer light source emitting light having a predetermined spot diameter and a reduction lens to expand the beam diameter with a uniform illuminance in conformity to the mask and the reduction lens to thereby facilitate the printing out of the mask pattern uniformly onto a wafer plane.

Namely, this invention provides an integrator capable of uniformly distributing a far-ultraviolet beam radiated from the excimer light source using a lens effect created by a plurality of parallel or concentric-circular recesses formed on at least one of two main opposing surfaces of a synthetic quartz plate transparent to light, for example, within a range of visual light to light having a wavelength of 200 nm the plate serving as the base material of a light-transparent substrate.

In addition, this invention is also drawn to a reduction-projection exposure apparatus using such an integrator.

An integrator according to this invention ensures uniform light distribution using unique recesses and is useful for an optical device which requires uniformity of light radiated from a light source.

The Provision of at least one of such integrator in an optical path between the excimer light source and reduction lens causes the beam diameter of the excimer light source to be uniformly expanded to an illumination area necessary for a mask which performs reduction-projection exposure. Thus the entire face of a portion of a wafer to be illuminated can be illuminated with excimer laser light uniform in illuminance to thereby facilitate the realization of a uniform hyperfine resist pattern.

It is preferable to dispose an optical element including a condenser lens or the like between the integrator and the mask for control of the focus point.

While the novel features of the invention are set forth in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 6A is a front view of an integrator having a plurality of parallel dish-like recesses;

FIG. 6B is a cross-sectional view taken along the line VI—VI' of FIG. 6A;

DETAILED DESCRIPTION OF THE INVENTION

Figure 1:
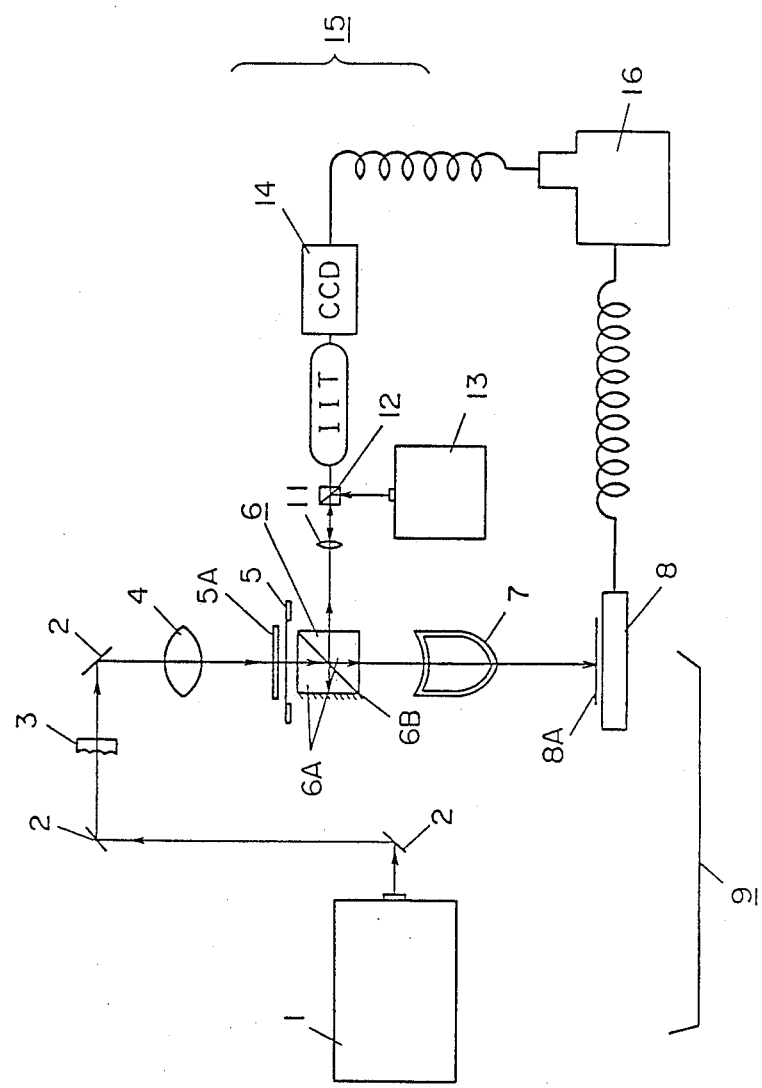
FIG. 1 is a schematic diagram illustrating an excimer exposure apparatus of one embodiment of this invention.
Figure 2A:
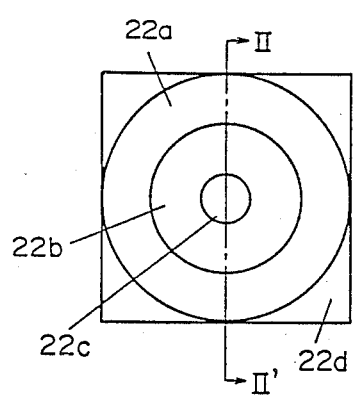
FIG. 2A is a front view of an integrator of one embodiment of this invention.
Figure 2B:
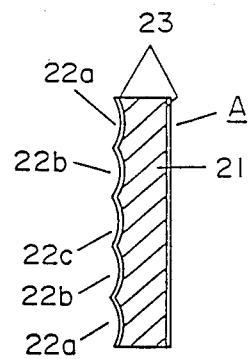
FIG. 2B is a cross-sectional view taken along the line II—II' of FIG. 2A.

FIG. 1 shows an excimer exposure according to one embodiment of the present invention. This apparatus includes a main unit which includes an excimer light source 1 which emits excimer laser light, optical mirrors 2, an integrator 3, a condenser lens 4, a mask holder 5 holding a mask 5A, a beam splitter 6, a reduction-projection lens 7, and a wafer stage 8 on which a semiconductor wafer 8A is disposed; an optical alignment system 15 which includes an alignment lens 11, an alignment beam splitter 12, an alignment light source 13 and an image reading camera 14; and a computer 16 which processes signals from the optical alignment system 15 and controls the movement of the wafer stage. The integrator 3 used in such an apparatus has the shape such as, for example, a square shape having sides 2-4 cm long, as shown in FIGS. 2-5 (it may alternatively have a circular shape. FIG. 2 shows an integrator A which includes a light-transparent substrate 21, for example, a synthetic quartz plate transparent to light within the range of visual light to light having a wavelength of 200 nm, and having a plurality of concentric-circular dish-like recesses 22 (22a, 22b, 22c, 22d) thereon, and a reflection-preventive multi-coating 23 (a multilayered film) formed thereon. This embodiment employs four concentric-circular recesses 22a–22d.

Figure 3:
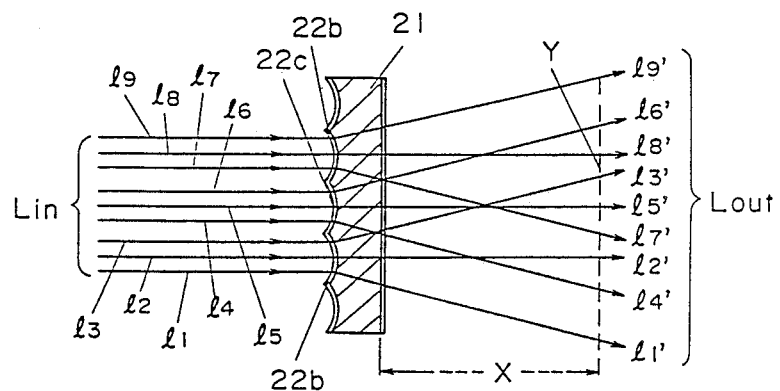
FIG. 3 is illustrates the distribution of a beam by the integrator of FIG. 2.

The light distribution characteristic of the integrator of FIG. 2 will now be described with reference to FIG. 3. First, generally, an incident light beam Lin from the excimer light source has an uneven illuminance distribution of more than 10%. For example, light rays 14, 15, 16 close to the central axis are relatively strong while remoter light beams 11, 12, 13, 17, 18, 19 are less strong. Incident rays entering the respective concentric-circular recesses 22a–22c on substrate 21 are distributed by the corresponding recesses and radiated from substrate 21 as dispersed radiated rays Lout. The rays 11'–19' denote the corresponding dispersed rays of 11–19. For example, the rays entering recesses 22b and 22c are both distributed over the entire Y plane at a distance X from substrate 21 (for example, at the position of condenser lens 4 in FIG. 1; an illuminated plane Y in FIG. 3). Therefore, at Y, strong and less strong portions of the incident rays are both distributed over the entirely of the Y plane so that the illumination intensity on the Y plane is very uniform. The integrator in FIG. 2 has concentric-circular recesses thereon, so that the distribution of FIG. 3 is produced circumferentially, namely, in over an area corresponding to 360 degrees to thereby provide a uniform illumination distribution over the entire Y plane. It is to be noted that X is selected so as to be on the order of 50 cm–1 m. The size of plane Y in which illuminance is to be uniform and the distance X can be determined by the curvature of the respective recesses 22a–d. The respective curvatures of recesses 22a–22d may be selected to differ from each other to improve the uniformity illuminance in the plane Y.

Therefore, if the Y plane is selected so as to be, for example, at the position of condenser lens 3 of the exposure apparatus of FIG. 1, photo-mask 5A can be irradiated with light having a uniform illuminance distribution. This is very useful for printing the pattern of mask A via a reduction-projection lens 7 onto a wafer 8A because exposure can be performed with a uniform illuminance to form a submicron pattern. This exposure using uniform illuminance becomes more effective as the width of the pattern becomes narrower, and especially advantageous in the formation of a hyperfine pattern of less than 0.5 μm. The laser light from the excimer light source usually provides a large uneven illuminance, for example, of about 10% compared to a superhigh voltage mercury-arc lamp having an uneven illuminance, for example, of about 2.5%. Therefore, an integrator capable of providing uniform illuminance distribution over an entire area corresponding to 360 degree or the entire plane Y, as shown in FIG. 2, is very effective in an exposure apparatus using an excimer light source. Condenser lens 3 is what is called a "focusing optical system" for control of the focal point and may be a concave mirror.

Figure 7A:
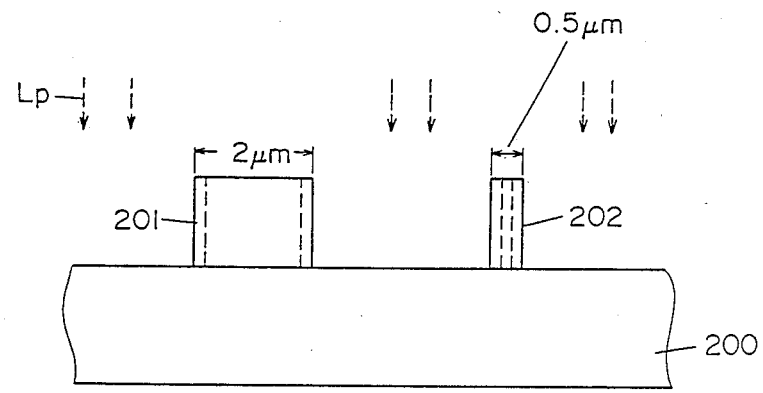
FIGS. 7A, B illustrate the influence of uneven exposure by a light source on the resist pattern.

Consider for example, as shown in FIGS. 7A, B that a 2 μm-wide positive resist pattern 201 and a 0.5 μm-wide resist pattern 202 are formed on a semiconductor substrate 200. If the exposure illuminance by beam $L_P$ has increaesd by 5–6% at a certain exposure area on substrate 200, the dimensions of the pattern usually narrow by about 0.2 μm on one side. At this time, as shown in FIG. 7A, resist patterns 201, 202 become thin as shown by the broken lines. This is practically negligible for the 2 μm-wide resist pattern 201, but the 0.5 μm-wide resist pattern 202 becomes unusable or cannot form a pattern.

Figure 7B:
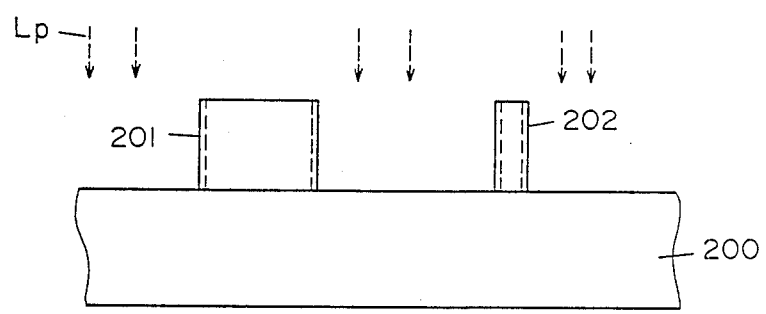

On the other hand, if uneven illuminance is improved by about 2% using the integrator according to the present invention, the narrowing of the pattern will be limited to within a reduction of 0.05 μm on one side at a portion where the illuminance is increased by about 2%. Therefore, as shown in FIG. 7B, the pattern becomes less thin, as shown by the broken lines in FIG. 7A, and a resist pattern 202, of for example, 0.5 μm is also usable practically and hence, the accuracy of forming a pattern improves. It is to be noted that expansion of a pattern occurs at the portion where the illuminance becomes low. In this case, the width of the resist pattern which should originally be 0.5 μm wide increases greatly and becomes practically unusable. This applies to a negative resist except that the thinning and expansion of a pattern are reversed to those in the positive resist.

As described above, limiting uneven illuminance of an excimer light beam in the excimer exposure apparatus to a value, for example, of less than 2% using the integrator according to this invention is very effective in forming a resist pattern of less than about 0.5 μm.

Figure 4A:
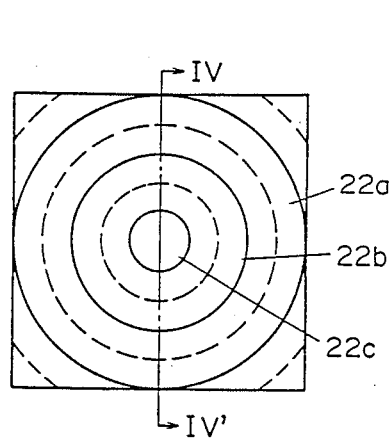
FIG. 4A is a front view of an integrator of another embodiment of this invention.
Figure 4B:
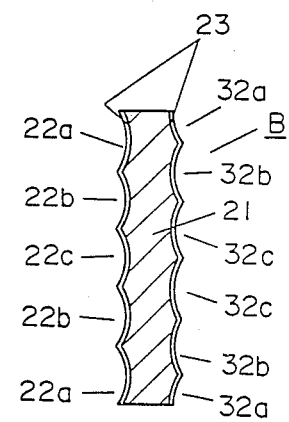
FIG. 4B is a cross-sectional view taken along the line IV—IV' of FIG. 4A.

FIG. 4 shows a light-transparent substrate 21 having a plurality of concentric-circular dish-like recesses 22a–22c and 32a–32d on its two main opposing surfaces. The recesses 22a–22c are offset with respect to recesses 32a–32d. The use of an integrator of this type B serves to further shorten the distance X referred to in FIG. 3 as well as to improve the uniformity of light distribution.

Figure 5:
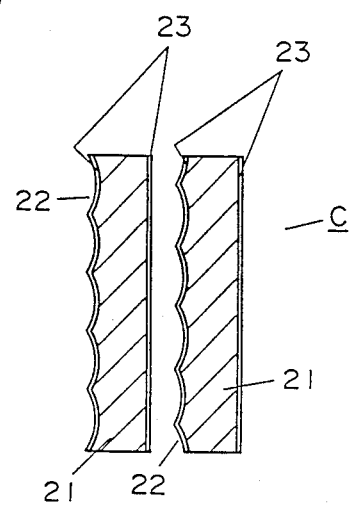
FIG. 5 is a cross-sectional view of an integrator of another embodiment of this invention.

FIG. 5 illustrates a structure comprising two integrators of the type A of FIG. 2 and superposed in an offset relationship, similar to the type B of FIG. 4. This integrator is easily manufactured by working only one surface of each substrate workpiece.

FIG. 6 shows an integrator D having a plurality of parallel (not concentric-circular) dish-like recesses 100 thereon. The uniformity of illuminance by this integrator is less than that of the integrators of FIGS. 2-5. If this integrator is used together with an A, B or C type integrator by superposing integrator D on the A, B or C type integrator, integrator D first may convert the beam to a square beam and then the A–C type integrators may render the square beam uniform when the excimer light source emits a parallelogram beam. This structure is very advantageous when used with the exposure apparatus.

Of course, it goes without saying that an integrator according to this invention is usable in any optical device that calls for enlarging the diameter of an emitted beam, in addition to exposure apparatuses.

Another embodiment of this invention will now be described in FIGS. 8-11. The integrator used in the excimer exposure apparatus of FIG. 1 has a shape such as, for example, a square shape having sides 2-4 cm long, as shown in FIGS. 8-11 (it may also have a circular shape). FIG. 8 shows an integrator A which includes a light-transparent substrate 121, for example, of a synthetic quartz plate transparent to light within the range of visual light to light having a wavelength of 200 nm, and having a plurality of parallel dish-like recesses 122 (122a, 122b, 122c, 122d, 122e) thereon, and a reflection-preventive multi-coating 123 (a multilayered film) formed thereon. This embodiment shows the use of five parallel recesses (22a-22e).

The light distribution characteristic of the integrator of FIG. 8 will now be described with reference to FIG. 9. First, generally, an incident light beam Lin from the excimer light source has an uneven illuminance distribution of more than 10%. For example, light rays 14, 15, 16 close to the central axis are relatively strong while remoter light beams 11, 12, 13, 17, 18, 19 are less strong. Incident rays entering the respective parallel recesses 122a-122c on substrate 121 are distributed and radiated from substrate 121 as dispersed radiated rays Lout. The rays 11'-19' denote the corresponding dispersed rays of 11-19. For example, the rays entering recesses 122b and 122c are both distributed over the entire Y plane at a distance X from substrate 121 (for example, at the position of condenser lens 4 in FIG. 1; an illuminated plane Y in FIG. 9). Therefore, at Y, strong and less strong portions of the incident rays are each distributed over the entirety of the Y plane, so that the illumination intensity on the Y plane is very uniform. It is to be noted that X is selected so as to be on the order of 50 cm-1 m. The size of the plane Y in which illuminance is to be uniform and the distance X can be determined by the curvature of the respective recesses 122a-122e. The respective curvatures of recesses 122a-122e may be selected to differ from each other to improve the uniformity of illuminance in the plane Y. In order to form the integrator of FIG. 8, recesses are required to be formed on only one surface of the substrate 121 and are very easy to form.

However, the use of only this integrator provides uniform illuminance in only a direction normal to the parallel recesses and results in uneven illuminance in a direction parallel to the parallel recesses.

Figure 8A:
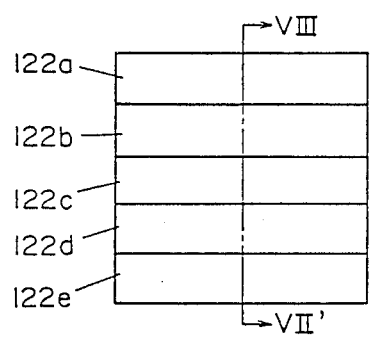
FIG. 8A is a front view of an integrator of another embodiment of this invention.
Figure 8B:
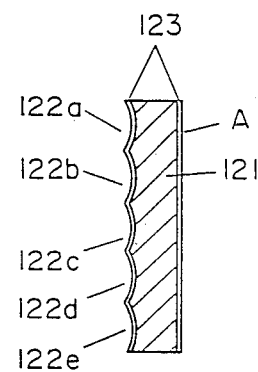
FIG. 8B is a cross-sectional view taken along the line VIII—VIII' of FIG. 8A.
Figure 9:
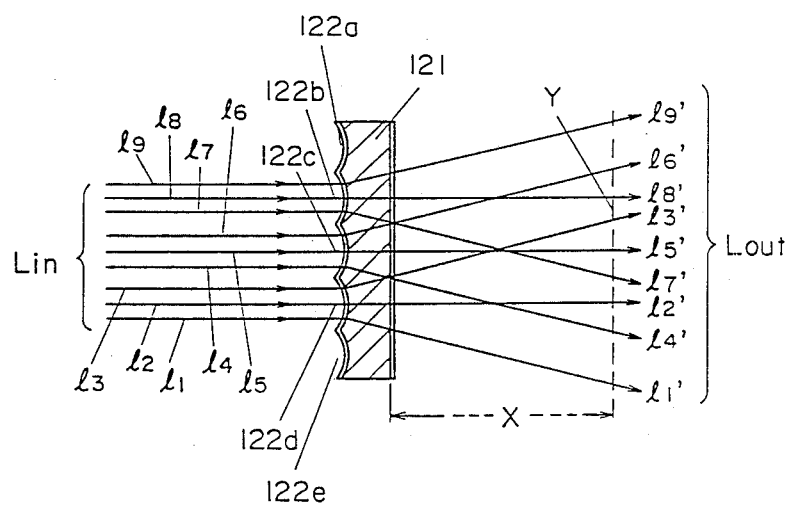
FIG. 9 is illustrates the distribution of a light beam by the integrator of FIG. 8.
Figure 10:
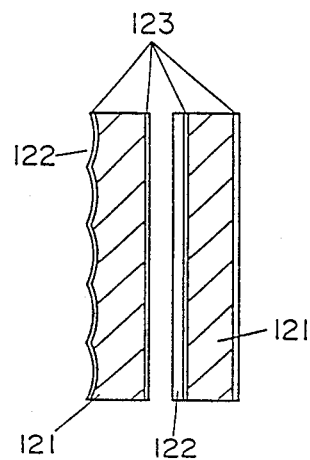
FIG. 10 is a cross-sectional view of a integrator of a further embodiment of this invention.
Figure 11A:
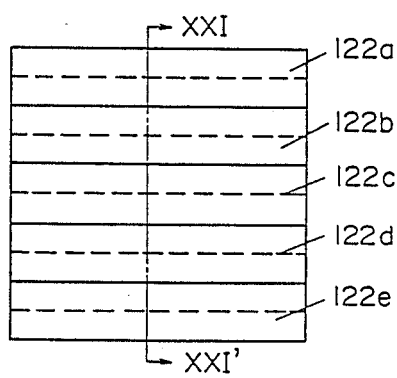
FIG. 11A is a front view of an integrator of a still further embodiment of this invention.
Figure 11B:
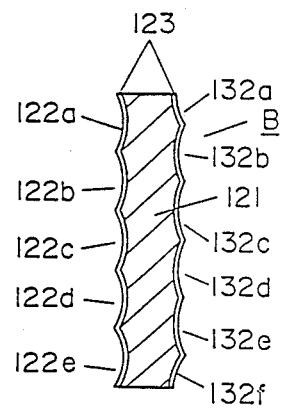
FIG. 11B is a cross-sectional view taken along the line X1—X1' of FIG. 11A.

This problem is solved by superposing at least two integrators of the type shown in FIG. 8A so that the parallel recesses 122 in one integrator intersect those in another integrator, as shown in FIG. 10. In this case, uniform illuminance is obtained in a direction normal to the parallel recesses in each integrator and as a result, very uniform illuminance, for example, having a variation of about 2%, is obtained over the entire illuminated plane. While FIG. 2 shows the use of two orthogonal superposed integrators, it does not matter whether or not the intersecting angle of the integrators deviates slightly from an ideal one. In FIG. 10, an integrator for providing highly uniform illuminance is obtained by combining two workpieces each of which is easy to manufacture. FIG. 11 shows an integrator having recesses similar to those in FIG. 8 on each of the main opposing surfaces of the substrate with the recesses on one surface offset with respect to those on the other surface. With the integrator shown in FIG. 11, the distance X referred to in FIG. 9 can be further shortened to thereby improve the uniformity of illuminance. However, manufacture thereof is difficult compared to combining two workpieces each having recesses only on one surface thereof, as shown in FIG. 10.

The above-described integrator is used as the integrator 3 in the exposure apparatus of FIG. 1 and if the uniform illuminance plane is selected to be, for example, at the position of condenser lens 3 of the exposure apparatus of FIG. 1, photo-mask 5A can be irradiated with light having a uniform illuminance distribution. The apparatus of FIG. 1 may employ the integrator of FIG. 10. This is very useful for printing the pattern of mask A via a reduction-projection lens 7 onto a wafer 8A because exposure can be performed with a uniform illuminance to form a submicron pattern. This exposure using uniform illuminance becomes more effective as the width of the pattern becomes narrower, and especially advantageous in the formation of a hyperfine pattern of less than 0.5 $\mu$m. The laser light from the excimer light source usually is emitted with a large uneven illuminance, for example, of about 10% compared to a super-high voltage mercury-arc lamp emitting light having an uneven illuminance, for example, of about 2.5%. Therefore, an integrator such as the integrator according to this invention capable of providing uniform illuminance distribution is very effective in an exposure apparatus using an excimer light source. Condenser lens 4 is what is called a "focusing optical system" for control of the focal point and may be a concave mirror or the like.

Consider, for example, that, as shown in FIGS. 7A and 7B a 2 $\mu$m-wide positive resist pattern 201 and a 0.5 $\mu$m-wide resist pattern 202 are formed on a semiconductor substrate 200. If the exposure illuminance by beam $L_P$ has increased by 5-6% at a certain exposure area on substrate 200 (wafer 8A), the dimension of the pattern usually become narrower by about 0.2 $\mu$m on one side. At this time, as shown in FIG. 7A, resist patterns 201, 202 become thin as shown by the broken lines. This is practically negligible for the 2 $\mu$m-wide resist pattern 201, but the 0.5 $\mu$m-wide resist pattern 202 becomes unusable or cannot form a pattern.

On the other hand, if uneven illuminance is improved by about 2% using the integrator according to this invention, the narrowing of the pattern will be limited to within a value of 0.05 $\mu$m on one side at a portion where the illuminance is increased by about 2%. Therefore, as shown in FIG. 7B, the pattern becomes less thin, as shown by the broken lines in FIG. 7B, and a resist pattern 202, for example, of 0.5 $\mu$m is also practically usable and hence, the accuracy of forming a pattern improves. It is to be noted that expansion of a pattern occurs at the portion where the illuminance becomes low. In this case, the width of the resist pattern which should originally be 0.5 $\mu$m wide increases greatly and becomes practically unusable. This applies to a negative resist except that the thinning and expansion of a pattern are reversed to those in the positive resist.

As described above, limiting uneven illuminance of an excimer light beam in the excimer exposure apparatus to a value, for example, of less than 2% using the integrator according to this invention is very effective in forming a resist pattern of less than about 0.5 $\mu$m.

Of course, it goes without saying that an integrator according to this invention is usable in any optical devices that call for expanding the diameter of an emitted beam, in addition to exposure apparatuses.

By the use of the integrators of this invention, it is possible to expand the beam diameter uniformly and easily so that the entire mask is uniformly illuminated even when an excimer light source capable of illuminating only a small area and exhibiting a large uneven illuminance is used. Especially, when a fine mask pattern on the order of a submicron is printed via an optical reduction lens system onto a semiconductor wafer, the integrator exhibits a big effect on the prevention of uneven exposure and/or the maintenance of the resolution.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. An exposure apparatus comprising:
an excimer light source for emitting excimer laser light, the light travelling along an optical path;
a reduction-projection lens disposed in said optical path and through which the light passes;
a wafer stage for holding a wafer in the optical path so as to be exposed to the light travelling therealong;
a mask holder disposed between said light source and said wafer stage for holding a mask to mask the light to which a wafer held by said wafer stage is exposed; and
an integrator disposed in said optical path between said light source and said wafer stage for distributing the light emitted from said light source over a predetermined area with uniform illuminance,
said integrator including a transparent substrate having two opposing surfaces, at least one of said surfaces being a light distributing surface for distributing light passing therethrough,
the entire said light distributing surface consisting of a plurality of concentric recesses.

2. An exposure apparatus as claimed in claim 1, wherein said integrator is disposed between said light source and said reduction-projection lens.

3. An exposure apparatus as claimed in claim 1, wherein said excimer light source is a KrF excimer laser means for emitting KrF excimer laser light.

4. An exposure apparatus as claimed in claim 1, and further comprising a focussing optical system disposed in said optical path between said integrator and said reduction projection lens for focussing the light along the optical path, said focussing optical system spaced from said integrator by a distance at which said predetermined area is disposed in a plane passing through said focussing optical system.

5. An exposure apparatus as claimed in claim 1, wherein said wafer stage is movably mounted in the exposure apparatus,
and further comprising an optical alignment system for issuing signals representative of the light to which a wafer held by said wafer holder is to be exposed, and a computer operatively connected to said alignment system for processing signals to control movement of said wafer stage in response to said signals.

6. An integrator for distributing light over a predetermined area with uniform illuminance, said integrator comprising:
a transparent substrate having two opposing surfaces, each of said surfaces being a light distributing surface for distributing light passing therethrough,
each entire said light distributing surface consisting of a plurality of recesses extending parallel to one another, and
respective borders defined between adjacent ones of said recesses constituting one of said opposing surfaces being offset with respect to respective borders defined between adjacent ones of said recesses constituting the other of said opposing surfaces.

7. An integrator as claimed in claim 6, wherein each of said parallel recesses has a cross section, as taken in a direction perpendicular to the direction in which said recesses extend parallel to one another, that is dish-shaped.

8. An exposure apparatus comprising:
an excimer light source for emitting excimer laser light, the light travelling along an optical path;
a reduction-projection lens disposed in said optical path and through which the ligh passes;
a wafer stage for holding a wafer in the optical path so as to be exposed to the light travelling therealong;
a mask holder disposed between said light source and said wafer stage for holding a mask to mask the light to which a wafer held by said wafer stage is exposed; and
an integrator disposed in said optical path between said light source and said wafer stage for distributing the light emitted from said light source over a predetermined area with uniform illuminance,
said integrator including a transparent substrate having two opposing surfaces, each of said surfaces being a light distributing surface for distributing light passing therethrough,
each entire said light distributing surface consisting of a plurality of recesses extending parallel to one another, and
resepctive borders defined between adjacent ones of said recesses constituting one of said opposing surfaces being offset with respect to respective borders defined between adjacent ones of said recesses constituting the other of said opposing surfaces.

9. An exposure apparatus as claimed in claim 8, wherein said integrator is disposed between said light source and said reduction-projection lens.

10. An exposure apparatus as claimed in claim 8, wherein said excimer light source is a KrF excimer laser means for emitting KrF excimer laser light.

11. An exposure apparatus as claimed in claim 8, and further comprising a focussing optical system disposed in said optical path between said integrator and said reduction projection lens for focussing the light along the optical path, said focussing optical system spaced from said integrator by a distance at which said predetermined area is disposed in a plane passing through said focussing optical system.

12. An exposure apparatus as claimed in claim 8, wherein said wafer stage is movably mounted in the exposure apparatus,
and further comprising an optical alignment system for issuing signals representative of the light to which a wafer held by said wafer holder is to be exposed, and a computer operatively connected to said alignment system for processing signals to control movement of said wafer stage in response to said signals.

13. An integrator for distributing light over a predetermined area with uniform illuminance, said integrator comprising:
a transparent substrate having two opposing surfaces, each of said surfaces being a light distributing surface for distributing light passing therethrough,
each entire said light distributing surface consisting of a plurality of concentric recesses, and respective borders defined between adjacent ones of said recesses constituting one of said opposing surfaces being offset with respect to respective borders defined between adjacent ones of said recesses constituting the other of said opposing surfaces.

14. An integrator as claimed in claim 13, wherein each of said concentric recesses has a cross section, as taken through the common center of said concentric recesses, comprising a dish shape.

* * * * *